United States Patent [19]
Urushima

[11] Patent Number: 5,869,887
[45] Date of Patent: Feb. 9, 1999

[54] SEMICONDUCTOR PACKAGE FABRICATED BY USING AUTOMATED BONDING TAPE

[75] Inventor: Michitaka Urushima, Tokyo, Japan

[73] Assignee: NEC Corporation, Tokyo, Japan

[21] Appl. No.: 537,261

[22] Filed: Sep. 29, 1995

[30] Foreign Application Priority Data

Oct. 4, 1994 [JP] Japan ..................................... 6-240111

[51] Int. Cl.$^6$ .................................................. H01L 23/06
[52] U.S. Cl. ........................... 257/684; 257/737; 257/778
[58] Field of Search .................................... 257/778, 779, 257/671, 672, 684, 737, 738, 702

[56] References Cited

U.S. PATENT DOCUMENTS

| 5,045,921 | 9/1991 | Lin et al. . | |
| 5,184,207 | 2/1993 | Cain | 257/671 |
| 5,224,264 | 7/1993 | Takahashi et al. . | |
| 5,350,947 | 9/1994 | Takekawa et al. | 257/778 |
| 5,420,460 | 5/1995 | Massingill | 257/778 |

FOREIGN PATENT DOCUMENTS

| 2674988 | 10/1992 | France . |
| 63-14455 | 1/1988 | Japan . |
| 63-34936 | 2/1988 | Japan . |

OTHER PUBLICATIONS

Motorola Technical Developments, vol. 17, Dec. 1992 Schaumburg, Illinois, US, pp. 74–76, XP 000329496, Harry Geyer 'New Tab Outer Lead Assembly Method–Tab Pad Grid Array Carrier'.

NEC Research and Development, vol. 35, No. 4, Oct. 1994, Tokyo JP, p. 496 'Development of Tape–BGA For Ultra–High Pin Count Applications'.

Nikkei Microdevices, Mar. 1994, pp. 58–64.

*Primary Examiner*—Peter Toby Brown
*Assistant Examiner*—Roy Potter

[57] ABSTRACT

A transparent base film of a semiconductor device package has a device hole into which a semiconductor chip is inserted. Formed on the base film are a plurality of pads arranged as a matrix from wirings for connecting the plurality of pads to the electrodes of the semiconductor chip. A transparent cover resist is applied to the entire surface of the base film except for the top portions of the plurality of pads, and spherical bumps are formed respectively on the plurality of pads. With this arrangement, it is possible to make inspection of bonding conditions between the bumps and the outer lead bonding pads on a printed circuit board even after the package is mounted on the printed circuit board.

11 Claims, 11 Drawing Sheets

SEMICONDUCTOR PACKAGE FABRICATED BY USING AUTOMATED BONDING TAPE

BACKGROUND OF THE INVENTION

The present invention relates to a semiconductor package fabricated by using a TAB tape (referred to as TAB package), and more particularly, to the TAB package mounted on a printed circuit board by means of bumps.

Referring to FIG. 12, the structure of a conventional TAB package will be described. FIGS. 12(a) and 12(b) are a plan view and a sectional view showing the conditions immediately after connection of a semiconductor chip to a TAB tape in the conventional TAB packaging. As shown in FIGS. 12(a) and 12(b), a TAB tape includes a base film 9 having sprockets 1 for the purposes of conveyance and positioning. A device hole 22 for insertion of a semiconductor chip 4 and outer lead bonding (OLB) holes 19 are formed in the base film 9, and a copper foil is bonded to the surface of the base film 9 with an adhesive 8. The copper foil is made into inner leads 6, outer leads 20 and test pads 21 through patterning by photolithography. As shown in FIGS. 12(a) and 12(b), the inner leads 6 project into the device hole 22, and the outer leads 20 extend to the test pads 21 across the OLB holes 19. The surface of the inner lead 6 is gold plated to form a protective film. The inner leads 6 are connected to inner lead bonding (ILB) bumps of the semiconductor chip 4 arranged in the device hole 22.

The surface of the semiconductor chip 4 is coated with a protective resin 10 as shown in FIGS. 12(c), then the outer leads 20 are cut to separate the semiconductor chip mounting part from the tape main body. Such a package is mounted on a printed circuit board 13 by pressure bonding of the outer leads 20 to the OLB pads 12 of the board 13 as shown in FIGS. 12(d).

However, in the above-mentioned TAB package, the bonding of the outer leads 20 to the printed circuit board 13 is extremely difficult because of the very small thickness of about 35 $\mu$m of the outer leads 20, so that it was necessary to prepare an OLB bonder dedicated to that purpose. Accordingly, it was necessary to mount such a package in a process different from that for other packages, such as a quad flat package (QFP), that can be mounted in a batch reflow process. Moreover, this bonding is done by thermocompression bonding, so that the product thus obtained lacks repairability. Because of this, the TAB package has been regarded as a special package which is devoid of the universality.

On the other hand, a ball grid array (BGA) package is introduced in NIKKEI Microdevices, March 1994 issue, pp. 58–64 as a package free from the above shortcomings and yet is superior in performance to the QFP. In this package, it is possible to increase the number of pins by employing a matrix-form arrangement of bumps on the surface of the package, and its electrical characteristics can be improved because of its small inductance.

In a tape BGA package in which a TAB tape is used as the substrate of the BGA package, the above-mentioned disadvantages can be dissolved. An example of the tape BGA package is disclosed in Japanese Patent Application Laid Open No. Sho 63-34936 (1988). However, in this package, through holes are formed in the base film and bumps to be bonded to the printed circuit board are formed via these through holes, so that it has a problem in that the fabrication process is complicated and the package obtained is very expensive.

Another example of the tape BGA package is disclosed in Japanese Patent Application Laid Open No. Sho 63-14455 (1988). However, this package has a problem in that the bonding inspection by visual observation after mounting on a printed circuit board is not possible because of the resin sealing of the entire surface of the TAB tape.

SUMMARY OF THE INVENTION

It is therefore an object of the present invention to provide an improved tape BGA package.

It is another object of the present invention to provide a tape BGA package which facilitates the bonding inspection by visual observation after mounting on the printed circuit board while maintaining a sufficient mechanical strength.

The tape BGA package according to the present invention has a transparent or translucent base film, a transparent or translucent cover resist applied to the entire surface except for the pad part formed on the base film and bumps formed on the pads. In this way, in the tape BGA package according to the present invention, bumps can be seen through the base film and the cover resist even after the mounting of the package on the printed circuit board, so that bonding inspection through visual observation is facilitated.

Further, the mechanical strength of the package can be reinforced by providing a reinforcing frame along the circumference of one principal surface of the package.

BRIEF DESCRIPTION OF THE DRAWINGS

The above and other objects advantages and features of the present invention will be more apparent from the following description taken in conjunction with the accompanying drawings, in which.

DETAILED DESCRIPTION OF THE PREFERRED EMBODIMENTS

Figure 1A:
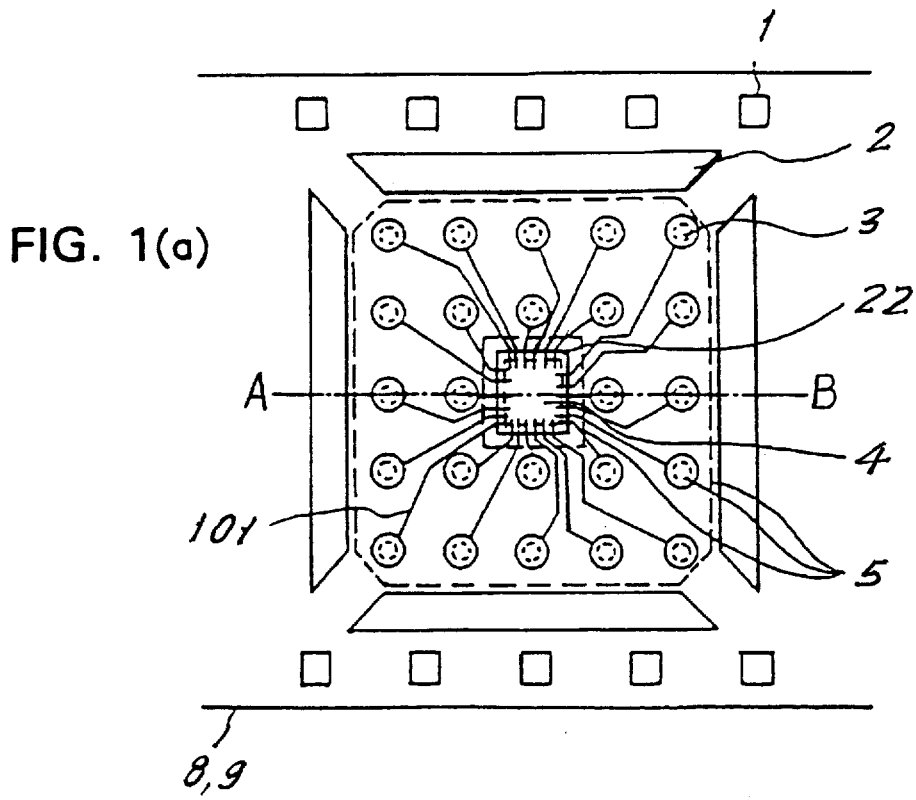
FIGS. 1 (a) to 1 (d) is a plan view at one fabrication stage of the tape BGA package and sectional views showing the processes of fabrication of the tape BGA package according to one embodiment of the present invention.
Figure 1B:
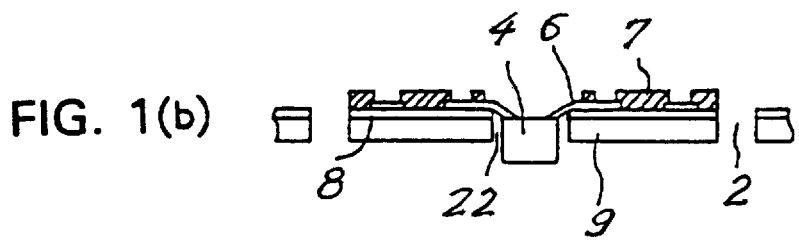
Figure 1C:
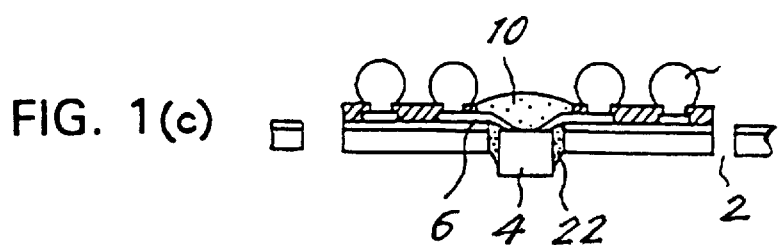
Figure 1D:
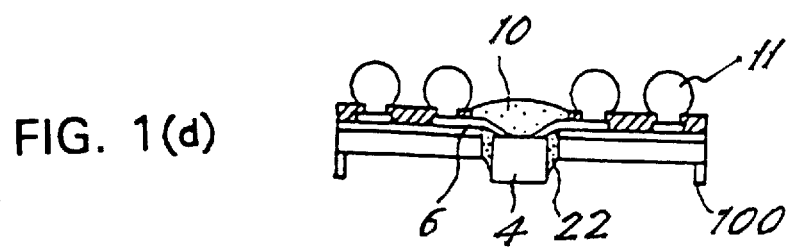

The fabrication method of the tape BGA package according to one embodiment of the present invention having a structure as shown in FIG. 1(d) will be described using FIGS. 1(a) to 1(c).

First, a device hole 22 and cut holes 2 are formed in a transparent base film 9 consisting of polyethylene terephthalate in which are formed sprocket holes 1 for conveyance and positioning. It is preferable that the thickness of the base film 9 is in the range of 50 to 125 $\mu$m. For the base film 9, a translucent polyimide resin can be used. Next, a metallic film such as a copper foil is bonded to the base film 9 using an adhesive 8, and a plurality of pads 3, a plurality of inner leads 6 and wirings 101 connecting the pads 3 to the leads 6 are formed by patterning the metallic film. Subsequently, a translucent cover resist 7 consisting of a polyimide resin is selectively applied by printing method to the entire surface of the portion of the base film 9 surrounded by the cut holes except for the central parts of the pads 3 and the inner leads 6, as shown by the broken lines 5. The preferable thickness of the cover resist 7 is 10 to 30 $\mu$m. Such are the conditions as shown in FIG. 1(a). Since the base film 9 is warped and its flatness is lost if an epoxy material with initial modules of elasticity of about 200 kg/mm$^2$ is used as the cover resist, it is preferable to use a material with initial modules of elasticity less than $\frac{1}{10}$, and especially preferably about $\frac{1}{20}$, of that of the base film. As indicated by the cover reresist lines 5, in applying the cover resist, it should be applied to the top parts of the pads 3 so as to form openings with diameter slightly smaller than the diameter of the pads, for example, to leave openings with diameter of 0.5 mm if the diameter of the pads is 0.6 mm. The pads 3 serve also as test pads. Next, the inner leads 6 are connected to electrode pads of the semiconductor chip 4 or the ILB bumps formed on the electrode pads as shown in FIG. 1(b).

Then, as shown in FIG. 1(c), for the purpose of protection of the semiconductor chip 4 and fixation of the semiconductor chip 4 to the inner leads 6 and the base film 9, a resin 10 is applied to a portion within the device hole 22 which includes the top part of the chip and a part above the base film 9. At that time, it is preferable that the thickness of the resin is within 250 $\mu$m from the top surface of the semiconductor chip 4.

Following that, solder balls are formed in the openings of the pads 3, and bumps 11 are formed by melting the balls in an N$_2$ atmosphere. The solder balls are formed to have a size slightly larger than the openings of the pads 3, for example, it is preferable that the diameter of the solder balls is about 0.8 $\mu$m when the openings have a diameter of 0.5 $\mu$m.

Next, after bonding a reinforcing frame 100 so as to surround the outer circumference of the rear surface of the base film 9 as shown in FIG. 1(d), the parts of the base film 9 that lie in the cut holes 2 are cut off to separate the package. In this manner, the tape BGA package according to the present invention is completed. Here, although the material of the reinforcing frame 100 needs not be limited, it is desirable to employ a plastic, resin, metal or the like. In addition, such a reinforcing frame 100 may also be formed along the outer circumference of the opposite surface, namely, the surface coated with the cover resist 7.

Figure 2:
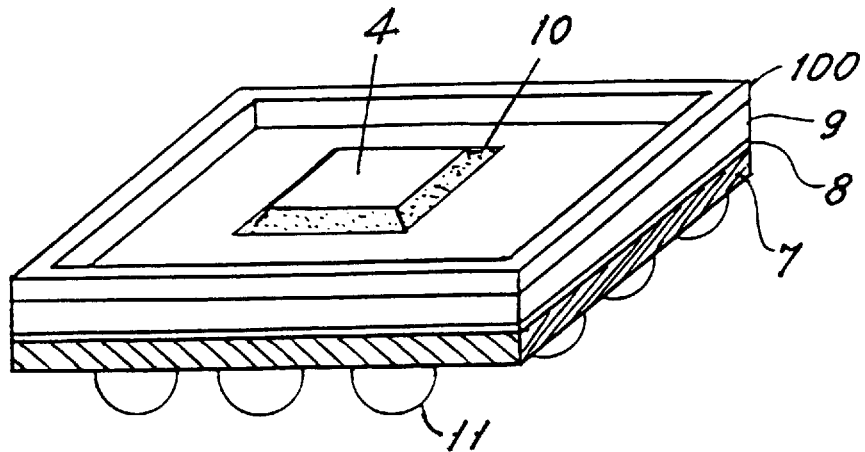
FIG. 2 is a perspective view of the tape BGA package according to one embodiment of the present invention.
Figure 3:
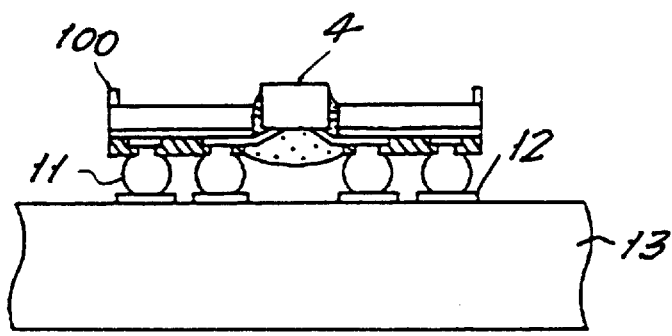
FIG. 3 is a sectional view showing the conditions in which the tape BGA package according to an embodiment of this invention is mounted on a printed circuit board.

The tape BGA package according to this embodiment of the present invention fabricated as in the above has a shape as illustrated in FIG. 2. As shown in FIG. 3, such a tape BGA package is mounted on the OLB pads 12 on the printed circuit board 13 by a batch reflow process along with other semiconductor packages.

Since the base film 9 and the cover resist 7 of the tape BGA package according to this embodiment fabricated as in the above are transparent or translucent, it is possible to directly and visually observe the bumps 11 through the base film 9 and the cover resist 7 even after the package is mounted on the printed circuit board 13. In the case that the base film 9 is made into the translucent polyimide resin, the bonding inspection through visual observation is further facilitated when infrared rays is used. Referring to FIG. 9, the inspection situation of the package by visual observation after the mounting will be described.

Figure 9A:
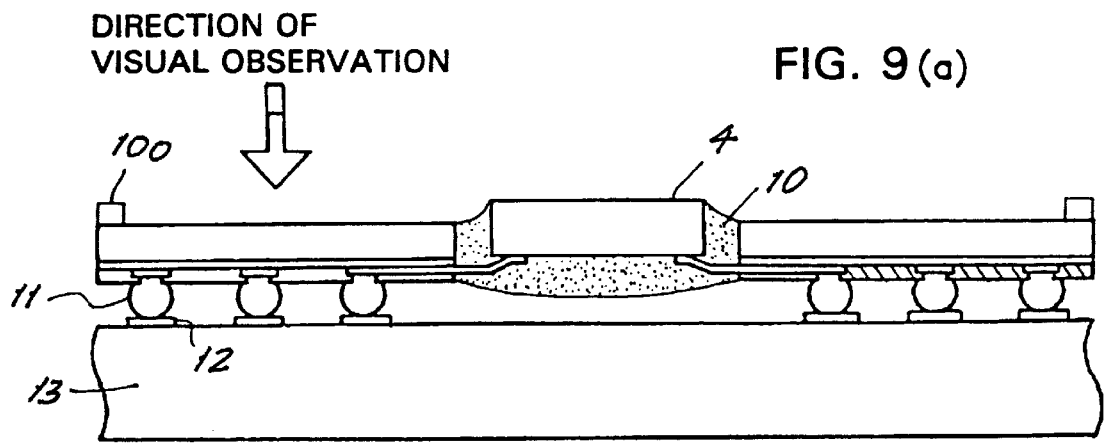
FIGS. 9(a) to 9(c) are diagrams illustrating the inspection of bonding of the tape BGA package according to one embodiment of the present invention to a printed circuit board.
Figure 9C:
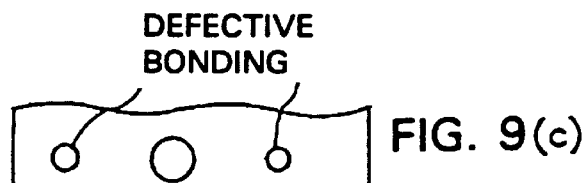
Figure 9B:
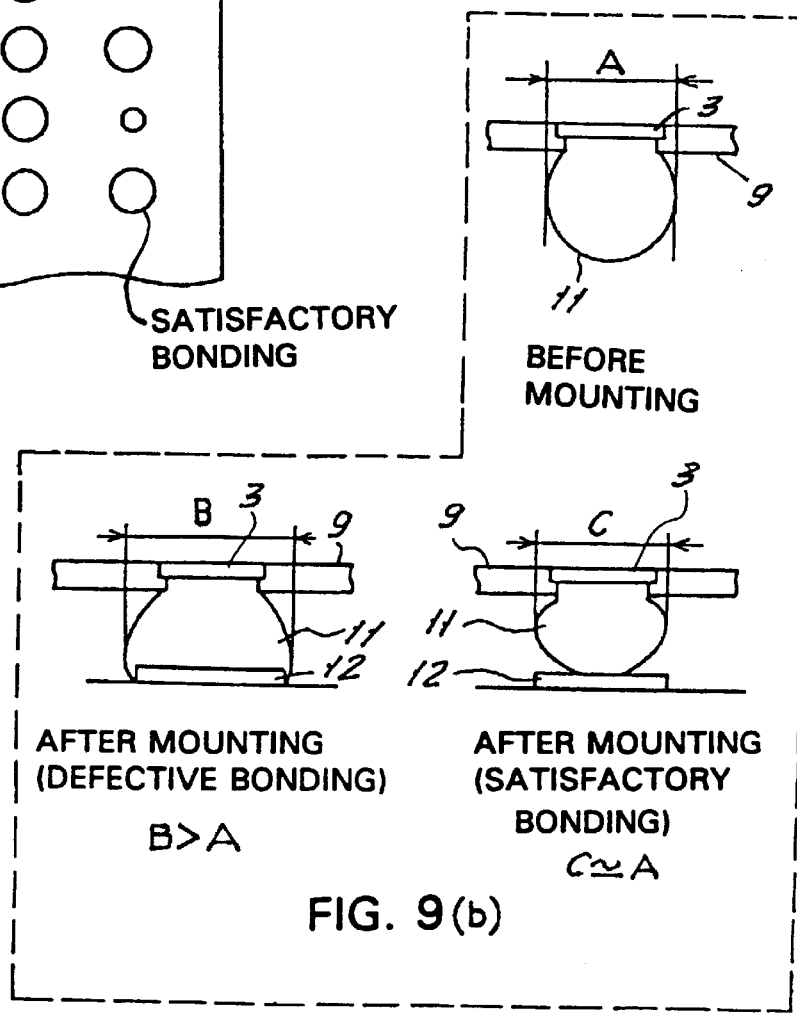

FIG. 9(a) is a general view of the tape BGA package of this embodiment after the mounting on the printed circuit board 13, and the arrow in the figure indicates the direction of visual observation. Before the mounting, bumps 11 with diameter A are prepared on the pads 3 as shown in FIG. 9(b). When the package is mounted, the bump is melted to be brought into contact with the OLB pad, and is expanded due to surface tension to a size with diameter substantially equal to B of the diameter of the OLB pad. However, if the contact is unsatisfactory due to insufficient melting or the like, the diameter of the bump remains at C which is not much different from A.

Accordingly, when the size of the bumps is observed in the direction of the arrow in FIG. 9(a) through the base film 9, bumps that are normally bonded are seen to have sizes substantially equal to that of the OLB pads whereas bumps with insufficient bonding are seen to have sizes smaller than that of the OLB pads, Therefore, the bonding between the pads 3 and the OLB pads 12 can readily be inspected by visual observation.

Figure 10:
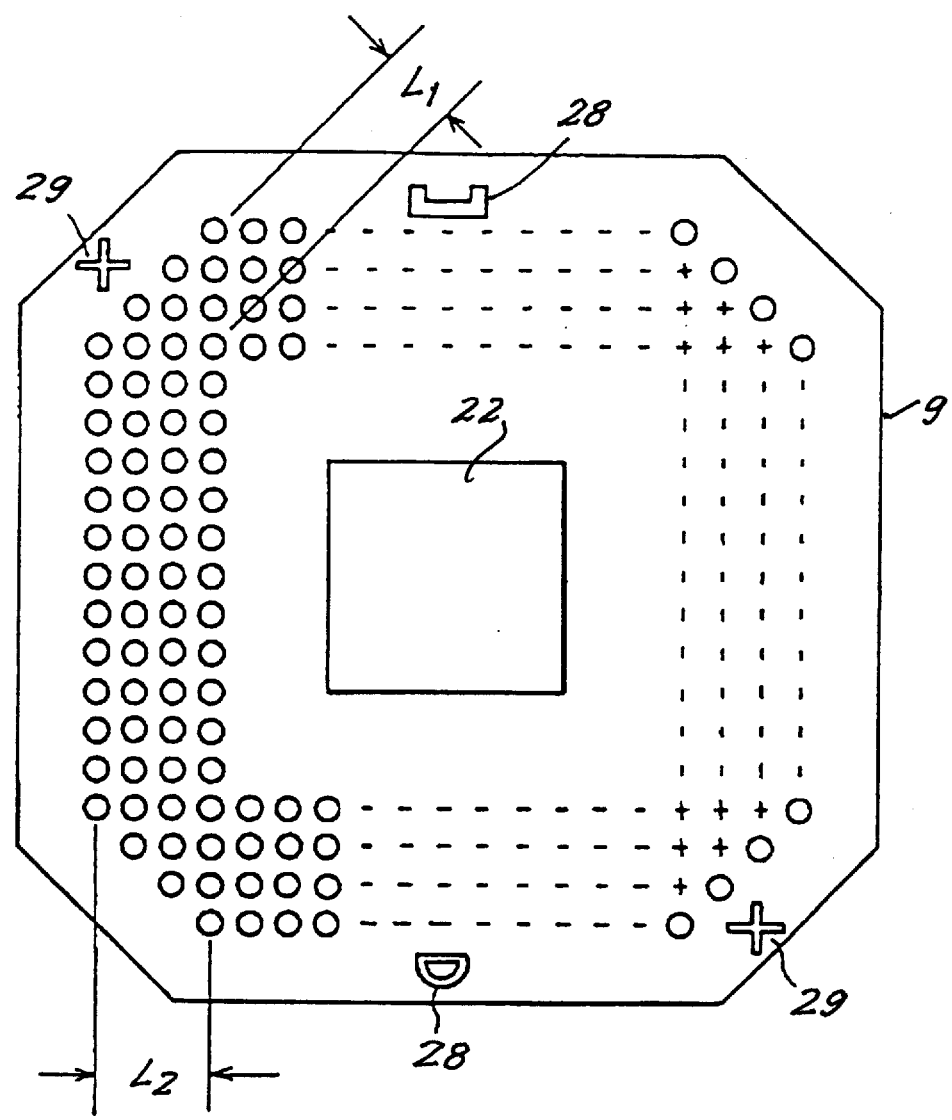
FIG. 10 is a diagram showing an example of giving various kinds of recognition patterns to the tape BGA package according to the present invention.

Moreover, by forming orientation recognition patterns 28 and position recognition patterns 29 within the package as shown in FIG. 10, the orientation and the position of the package during the mounting of the package on the printed circuit board 13 can readily be identified by observation through the base film 9. In that case, the orientation recognition patterns 28 and the position recognition patterns 29 can be produced without requiring an additional process if they are patterned simultaneous with the patterning of the pads 3.

Furthermore, the flatness of the bumps 11 can be maintained sufficiently well in this embodiment even without resin-sealing the entirety of the package since the outer circumference of the package is reinforced with the reinforcing frame 100. Therefore, at the time of mounting all the bumps 11 are positively brought into contact with the OLB pads 12. Moreover, since the frame 100 is formed only along the outer circumference of the package, the frame will be of no obstruction to the visual observation and the increase in the weight of the package can be suppressed to a minimum level. In addition, the reinforcing frame 100 may be a meshlike reinforcement in which holes are formed in the portions corresponding to the pads 3, the orientation recognition patterns 28 and the position recognition patterns 29, as long as it does not obstruct the visual observation. By so doing, the strength of the package will further be increased.

Further, if the reinforcement is transparent, it need not be made in the form of a frame.

Figure 5A:
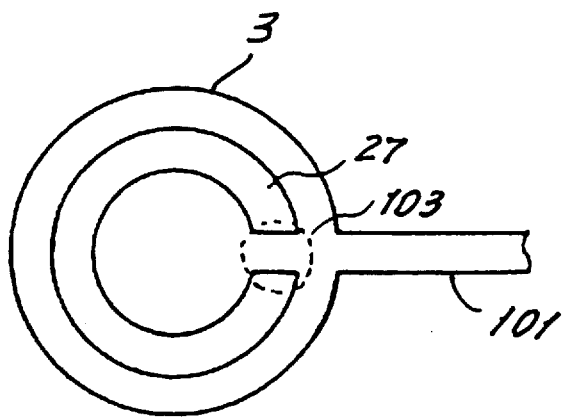
FIGS. 5(a) to 5(c) are diagrams showing the pad part of the tape BGA package according to the present invention.
Figure 5B:
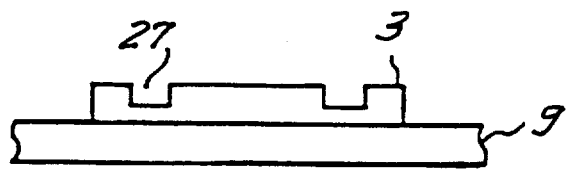
Figure 5C:
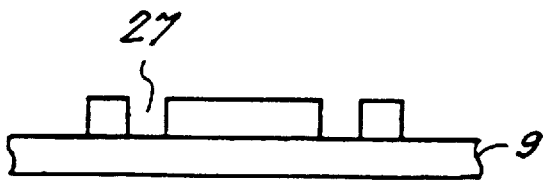
Figure 6A:
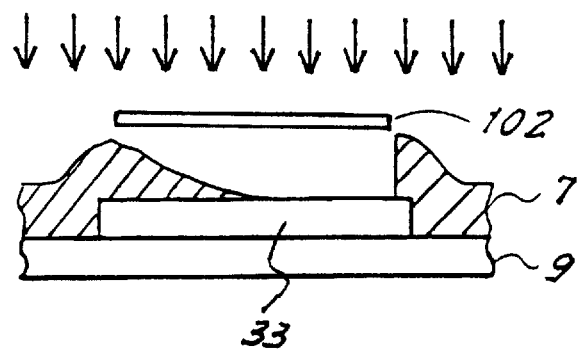
FIGS. 6(a) to 6(c) are sectional view showing the coating conditions of the cover resist depending upon the shape of the pad part.
Figure 6B:
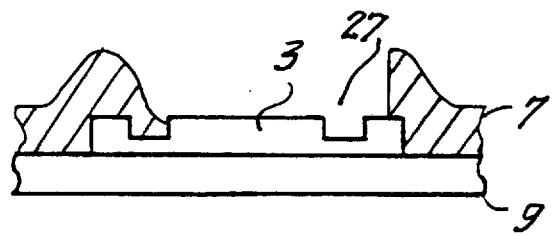
Figure 6C:
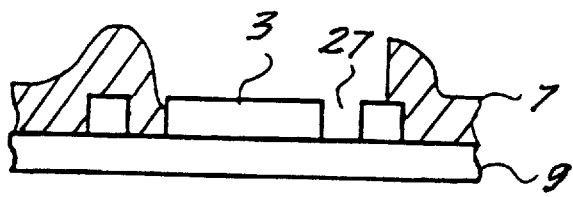

Moreover, the contact strength between the pad 3 and the bump 11 can be augmented if a ring-shaped recess 27 is formed in the pad 3 as shown in FIG. 5. Such a recess may be one formed by shallowly removing a portion of the pad 3 by etching as shown in FIG. 5(a), or one formed by removing the pad 3 by etching as deep as it reaches the base film as shown in FIG. 5(c). The formation of such a recess 27 also has an effect of preventing the defective electrical contact between the pad 3 and the bump 11. Namely, if the surface of the pad 3 is flat, at the time of application of the cover resist 7 by printing method, there is a possibility of infiltration of the cover resist 7, as shown in FIG. 6(a), even to the portion, that is, the central part of the pad 3 which is expected to be excluded from coating with the cover resist 7, by the action of the mask 102. If this happens, the exposed portion of the surface of the pad 3 becomes very narrow, and a sufficient electrical contact with the bump 11 to be formed later becomes difficult to be secured. However, if a recess 27 is prepared in the pad 3, the inflow of the cover resist 7 is obstructed by such a recess 27, as shown in FIGS. 6(b) and 6(c), and a sufficiently wide exposed area of the pad 3 is ensured, so that the generation of defective electrical contact can be prevented. The shape of the recess 27 need not be limited to that as shown in FIGS. 5 and 6, but it is preferable that there is left a portion 103 where no recess is formed as shown in FIG. 5(a). This is to prevent the complete isolation of the periphery and the central part of the pad 3 by the ring-shaped recess 27 when the recess 27 reaches the base film 9 as shown in FIGS. 5(c) and 6(c).

Figure 7:
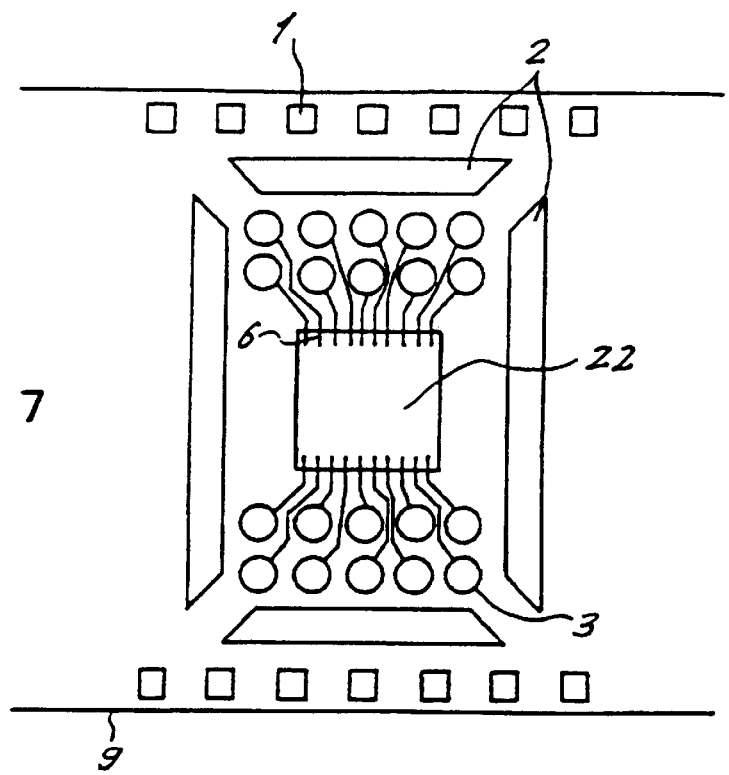
FIG. 7 is a diagram showing one example in which pads are arranged only on two sides of the semiconductor chip in the tape BGA package according to the present invention.

Further, when the number of the electrode pads of the semiconductor chip is small, the pads 3 may be arranged only in the direction of the sprockets 1 as shown in FIG. 7. By so doing, the cost of the materials can be reduced since the area used by the base film diminishes in proportion to the decreasing area of the package.

Figure 8:
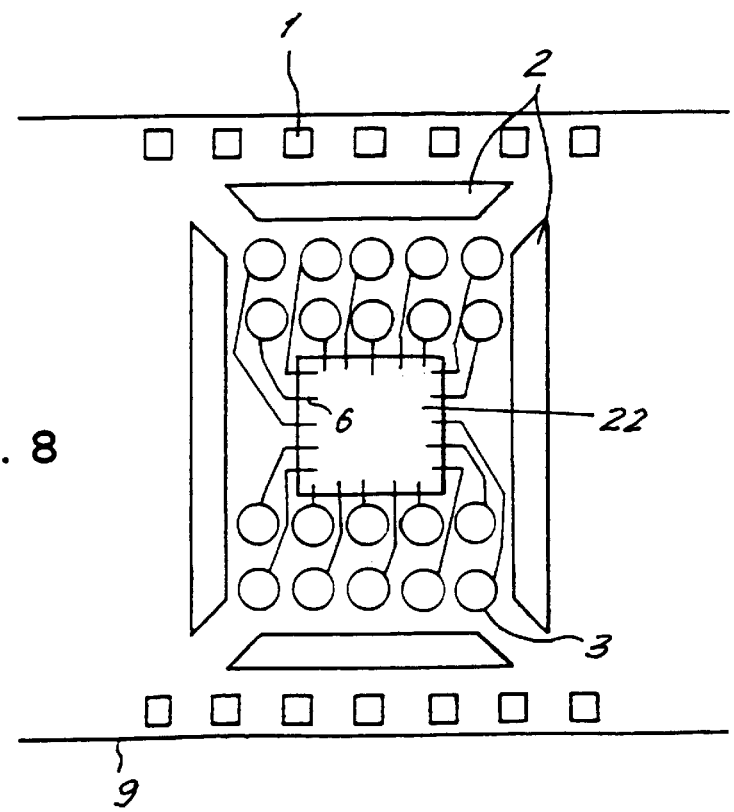
FIG. 8 is a diagram showing another example in which pads are arranged only on two sides of the semiconductor chip in the BGA package according to the present invention.

In that case, the inner leads 6 may be projected only in the direction in which the sprockets 1 are arranged as shown in FIG. 7 in conformity with the positions of the electrode pads in the semiconductor chip to be mounted, or may be projected from all sides as shown in FIG. 8. In contrast to the case of FIGS. 7 and 8, the pads 3 may be arranged only in the direction perpendicular to the direction of the sprockets 1. Furthermore, when the semiconductor chip is small in size and the number of the electrode pads is small, two or more semiconductor chips may be mounted on one package region surrounded by the cut holes 2, though not shown.

Further, when the number of the pads 3 is small as in FIG. 1(a), there will arise no problem even if they are arranged in a form to have their circumference to be a square or a rectangle, but when the number of the pads is large, the bumps 11 at the positions corresponding to their vertices of the circumference tend to peel off from the printed circuit board. Therefore, when the number of the pads is large, such as when four lines of pads are arranged along one side as shown in FIG. 10, it is recommended not to provide pads 3 for forming bumps 11 in portions that correspond to the vertices of the arrangement. In other words, by so doing, every bump will be surrounded by at least four bumps, so that no peeling of the pad 3 will occur thanks to the bonding forces of the bumps in the periphery. In that case, the electrical characteristics can also be improved by setting the pad arrangement length $L_1$ at the corner part to be substantially equal to the pad arrangement length $L_2$ at the central part of the side of the package.

Figure 11A:
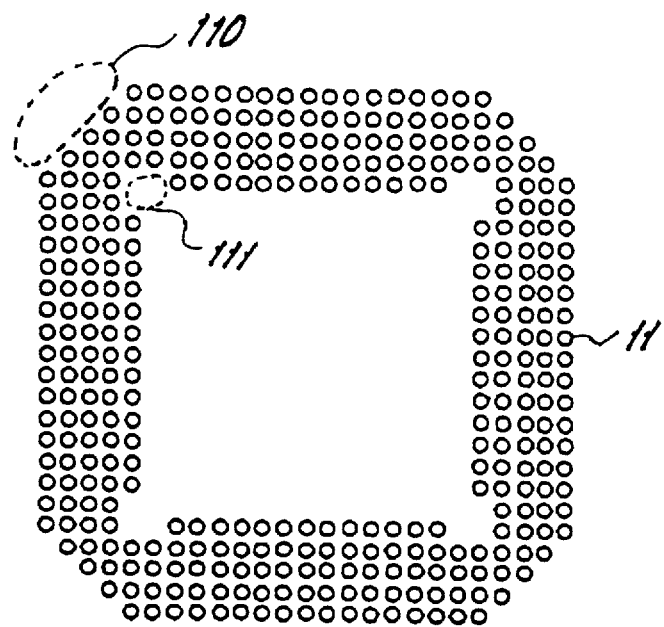
FIGS. 11(a) and 11(b) are diagrams showing examples of arrangement of pads and bumps in the tape BGA package according to the present invention.
Figure 11B:
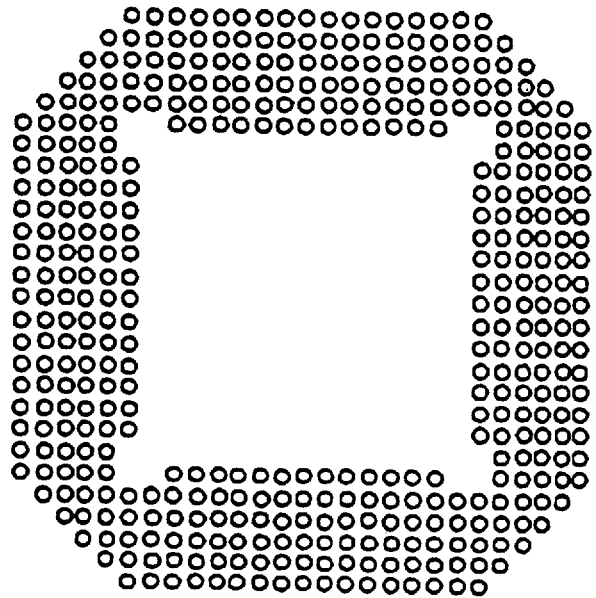
Figure 12A:
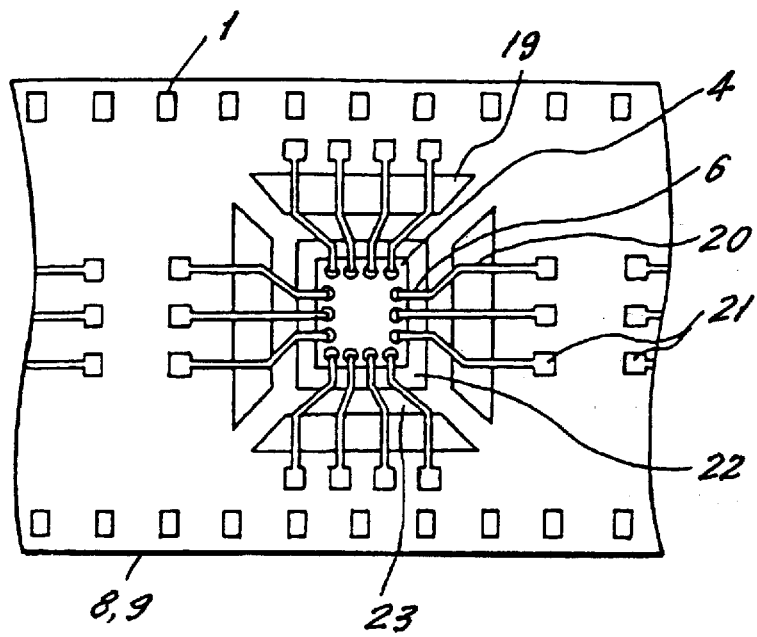
FIGS. 12(a) to 12(d) are diagrams showing the structure of the conventional TAB package.
Figure 12B:
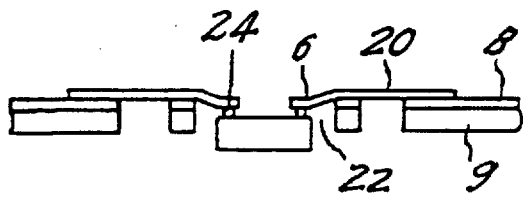
Figure 12C:
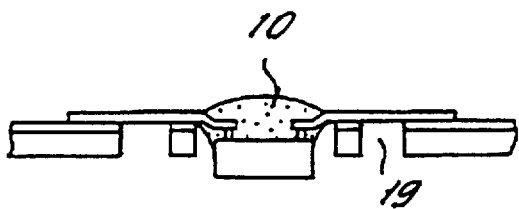
Figure 12D:
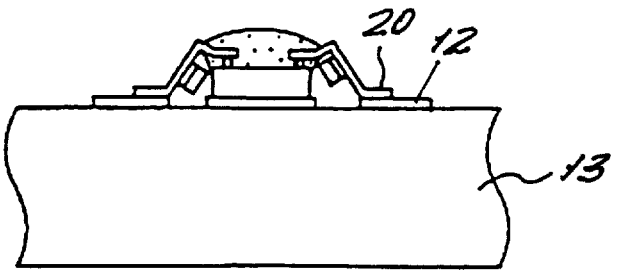

Moreover, when the number of pads is large, for example, when the pads are arranged in five or six lines along one side, as shown in FIG. 11, it is preferable that no bumps 11 are to be formed not only in the portions 110 corresponding to the vertices of the outer circumference, but also in the portions 111 corresponding to the vertices of the inner circumference. This is to relax the extreme difficulty in accommodating an overwhelming number of wirings between the pads and the inner leads that may be caused by assigning the portions 111 corresponding to the vertices of the inner circumference.

Figure 4A:
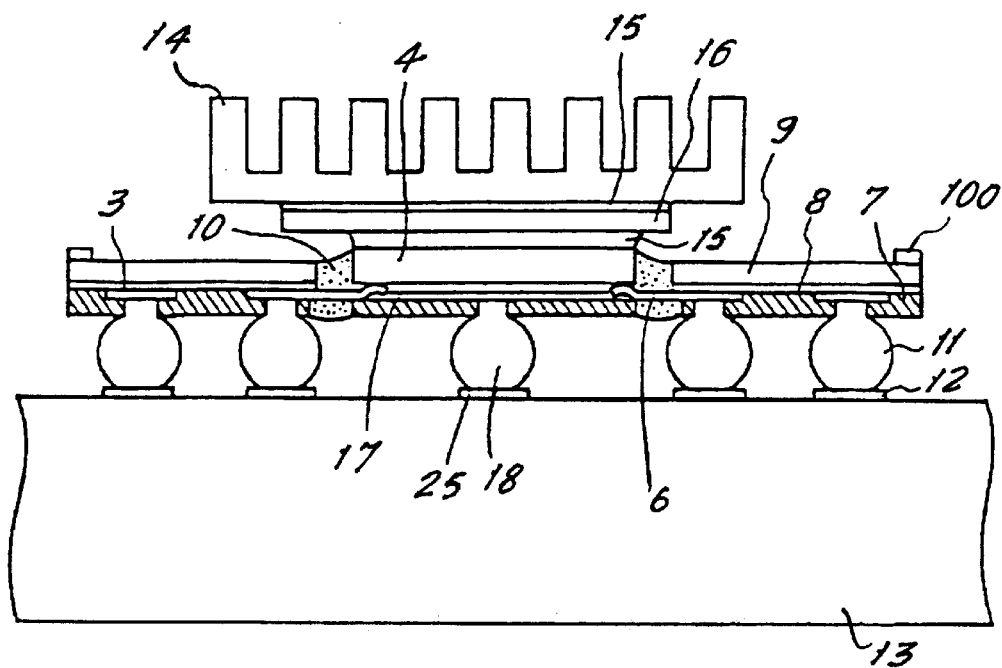
FIGS. 4(a) and 4(b) are a sectional view showing the mounting conditions of the tape BGA package and a plan view showing in detail the device hole part of the tape BGA package according to another embodiment of the present invention.
Figure 4B:
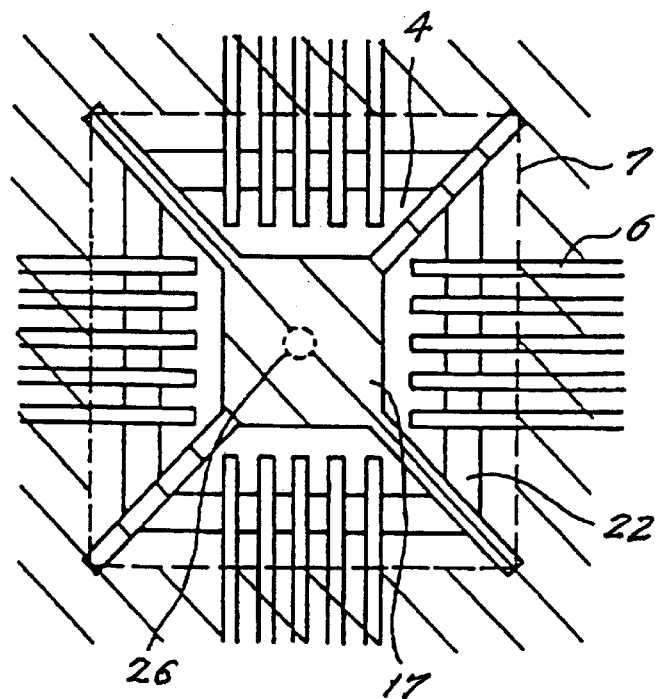

Next, another embodiment of the present invention will be described. As shown in FIG. 4(a), in this embodiment, a bump is formed also in the portion corresponding to the device hole 22 to effectively radiate heat generated by the semiconductor chip. For that purpose, a suspended lead 17 consisting of a metallic foil made of the same material as that of the wirings is formed in the device hole 22 as shown in FIG. 4(b). This suspended lead 17 is coated with the cover resist 7 by printing method, but the printing is done so as to create an opening 26 for the formation of a heat radiating bump 18 for efficiently radiating heat generated by the semiconductor chip 4 to the mounting board. In FIG. 4(a) is shown the case in which only one opening 26 is formed, but a plurality of openings may be formed. Next, bumps 11 are formed for the openings on the pads 3 and a heat radiating bump 18 is formed for the opening 26 according to the method describe in the above. In forming bumps by printing method, it is not necessarily required to make the size of the opening 26 to be equal to the opening size of the pads 3.

Figure 13A:
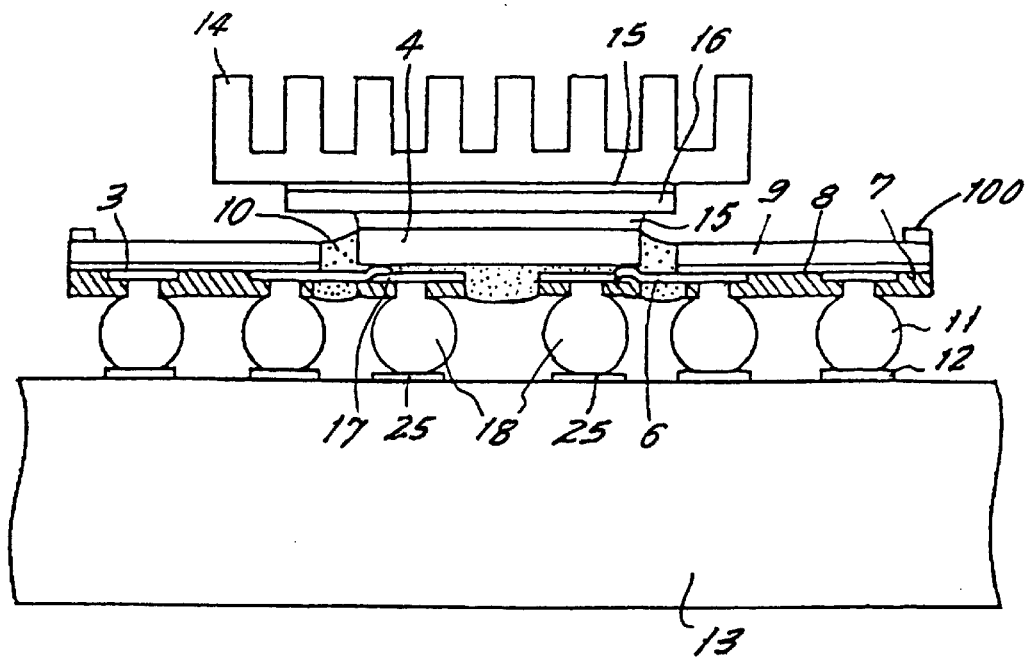
FIGS. 13(a) and 13(b) are a sectional view showing the mounting condition of the tape BGA package and a plan view showing in detail the device hole part of the tape BGA package according to still another embodiment of the present invention.
Figure 13B:
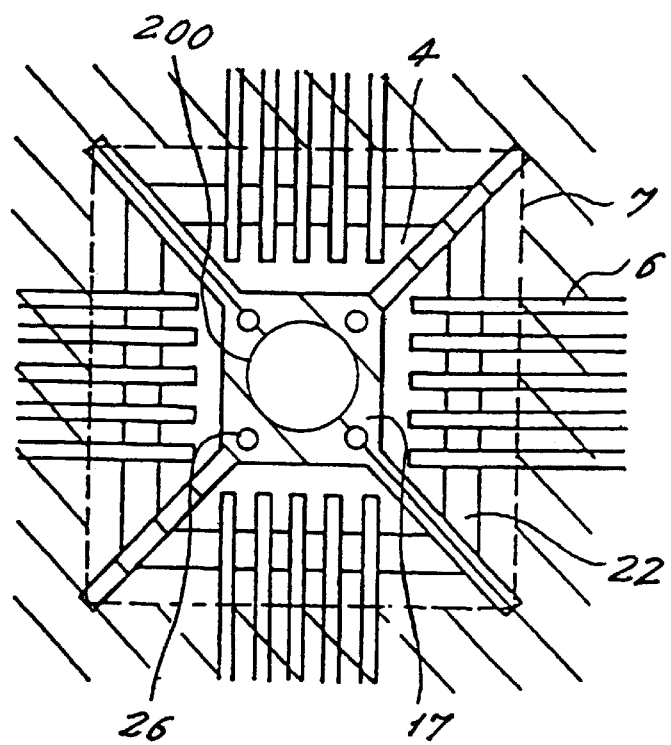

Next, bonding of the reinforcing frame 100 and resin sealing are carried out by a process similar to that in the above. However, coating of the resin 10 is carried out through the space between the suspended lead 17 and the device hole 22, and the resin is penetrated to the space between the suspended lead 17 and the semiconductor chip 4 by means of the capillary phenomenon. In the case that a through hole 200 is located in the suspended lead 17 as shown in FIG. 13, coating of the resin 10 can be carried out through this through hole 200. It is preferable that the suspended lead is held to be fixed by sucking it with a suction nozzle or the like to prevent it from sagging toward the semiconductor chip 4 until the sealing is completed.

The heat radiating bump 18 also has an effect of firmly fixing the semiconductor chip 4 after the completion of the mounting.

Further, it is recommended to attach a heat radiating plate 16 consisting of an aluminum plate or the like to the rear surface of the semiconductor chip with an adhesive 15 for heat radiation, as shown in FIG. 4(a), in order to improve the heat radiation. When more heat radiation is needed, attachment of a heat sink 14 to the upper part of the heat radiating plate 16 with the adhesive 15 for heat radiation will be effective. The attachment of the heat radiating plate 16 and the heat sink 14 is feasible also for the structure of the embodiment in the above. If a structure is employed in which the bonding of the heat radiating plate 16 covers also the base film 9, it will serve to prevent the warping of the package as a whole. Further, when the heat sink is provided in the above embodiment, and the heat sink 14 is so heavy that there is a possibility that the semiconductor chip sags without being able to withstand its weight, it is recommended to attach a plate that can keep the portion between the top part of the resin 10 and the printed circuit board 13 fixed to the printed circuit board 13 (not shown).

The structure of the solder ball may be such that a ball is formed using the solder alone. However, when the package as a whole becomes so heavy because of the installation of the heat sink 14 or the like, the solder bumps may be deformed significantly due to the weight during the process of mounting the package on the printed circuit board, generating a possibility of short-circuit between adjacent bumps. In such a case, short-circuiting can be prevented by increasing the strength of the bumps by giving them a double structure in which the core portions of the bumps are formed first using a hard metal such as copper or silver, then surrounding the periphery with the solder. Since, however, the unevenness of the base film and the printed circuit board will become less easy to be absorbed if the size of the core is too large, the size of the core should be selected appropriately corresponding to the material of the base film to be used and the accuracy of the printed circuit board.

Furthermore, although the material of the heat radiating plate needs not be limited, it is recommended to employ an alloy of copper/tungsten or copper/tungsten/nickel. The result of a temperature cycle test (for 100 cycles between −65° C. and 150° C.) and a pressure cooker test (at 125° C. and 100% for 500 h) showed that the alloys of copper/tungsten and copper/tungsten/nickel revealed no deformation. On the other hand, a copper/molybdenum alloy developed a deformation due to warping of the heat radiating plate, and generated peel-off and the like.

As described in the above, it is possible for the tape BGA package according to the present invention to readily inspect the bonding conditions of the bumps by visual observation through the base film and the cover resist even after the mounting of the package on the printed circuit board, since transparent or translucent materials are used for the base film and the cover resist. Moreover, the strength of the package can be increased without obstructing visual observation by installing a frame-shaped reinforcement and a transparent reinforcement.

What is claimed is:

1. A semiconductor device comprising:
   a base film having a first main surface and a second main surface opposite to said first main surface, a device hole selectively formed in said base film, and a plurality of pads formed on said first main surface of said base film apart from each other;
   a plurality of inner leads formed on said first main surface of said base film apart from each other, each of said inner leads being elongated from an associated one of said pads and projected over said device hole to provide a projection portion;
   a semiconductor chip having a plurality of electrodes and being held in said device hole by connecting each of said electrodes to said projection portion of an associated one of said inner leads;
   a plurality of bumps each formed on an associated one of said pads; and
   a reinforcing frame attached on one of said first and second main surfaces of said base film; and
   a cover resist film covering said base film and said wirings, each of said base film and said cover resist film being at least partially light transmitting.

2. The semiconductor device as claimed in claim 1, wherein each of said pads has a ring-shaped groove formed therein.

3. The semiconductor device as claimed in claim 1, wherein said cover resist film is composed of polyimide.

4. The semiconductor device as claimed in claim 1, wherein said base film comprises a material from a group of materials consisting of polyethylene terephthalate and polyimide.

5. A semiconductor device comprising:
   a base film having a first main surface and a second main surface opposite to said first main surface, a device hole selectively formed in said base film, and a plurality of pads formed on said first main surface of said base film apart from each other;
   a plurality of inner leads formed on said first main surface of said base film apart from each other, each of said inner leads being elongated from an associated one of said pads and projected over said device hole to provide a projection portion;
   a semiconductor chip having a plurality of electrodes and being held in said device hole by connecting each of said electrodes to said projection portion of an associated one of said inner leads;
   a plurality of bumps each formed on an associated one of said pads; and
   a reinforcing frame attached on one of said first and second main surfaces of said base film; and
   a base body located in said device hole and a plurality of legs supporting said base body, said semiconductor chip and said base body being adhered to each other by a resin.

6. A semiconductor device comprising:
   a base film having a main surface, a device hole selectively formed in said base film, a plurality of pads formed on said main surface of said base film apart from each other, and a plurality of wiring lines formed on said main surface of said base film apart from each other;
   each of said wiring lines having a first end portion connected to an associated one of said pads and a second end portion projecting from said main surface of said base film over said device hole;
   a semiconductor chip positioned in said device hole and having a plurality of electrodes each connected to said second end portion of an associated one of said wiring lines;
   a cover resist film formed to cover said main surface of said base film, said pads and said wiring lines;
   a plurality of contact holes selectively formed in said cover resist film apart from each other to expose respective parts of said pads;
   a plurality of bumps each formed in contact with an associated one of said parts of said pads;
   wherein each of said base film and said cover resist film is at least partially light transmitting.

7. A semiconductor device device comprising:
   a base film having a main surface, a device hole selectively formed in said base film, a plurality of pads formed on said main surface of said base film apart from each other, and a plurality of wiring lines formed on said main surface of said base film apart from each other;
   each of said wiring lines having a first end portion connected to an associated one of said pads and a second end portion protecting from said main surface of said base film over said device hole;
   a semiconductor chip positioned in said device hole and having a plurality of electrodes each connected to said second end portion of an associated one of said wiring lines;
   a cover resist film formed to cover said main surface of said base film, said pads and said wiring lines;

a plurality of contact holes selectively formed in said cover resist film apart from each other to expose respective parts of said pads;

a plurality of bumps each formed in contact with an associated one of said parts of said pads;

wherein each of said pads has a ring-shaped groove formed therein.

8. A semiconductor device comprising:

a semiconductor chip having a main rectangular surface and a plurality of electrodes formed along a periphery of said main rectangular surface;

a base film having a main surface, with a plurality of pads formed on said main surface of said base film in a grid array;

plurality of wirings each formed on said main surface of said base film and connected to an associated one of said pads on said main surface;

a plurality of inner leads each projected from said main surface of said base film and connected between said an associated one of said wirings and an associated one of said electrodes of said semiconductor chip;

an insulating layer covering said main surface of said base film, said pads and said wirings;

a plurality of holes formed in said insulating layer in a grid array to thereby expose respective parts of said pads; and a plurality of solder bumps formed in contact respectively with said parts of said pads to thereby provide a solder bump grid array; and wherein each of said base film and said insulating layer is at least partially light transmitting.

9. The semiconductor device as claimed in claim 8, wherein said base film comprises a material from a group of materials consisting of polyethylene terephthalate and polyimide.

10. The semiconductor device as claimed in claim 8, wherein said insulating layer is composed of polyimide.

11. A semiconductor device comprising:

a semiconductor chip having a main rectangular surface and a plurality of electrodes formed along a periphery of said main rectangular surface;

a base film having a main surface, with a plurality of pads formed on said main surface of said base film in a grid array;

a plurality of wirings each formed on said main surface of said base film and connected to an associated one of said pads on said main surface;

a plurality of inner leads each projected from said main surface of said base film and connected between said an associated one of said wirings and an associated one of said electrodes of said semiconductor chip;

an insulating layer covering said main surface of said base film, said pads and said wirings;

a plurality of holes formed in said insulating layer in a grid array to thereby expose respective parts of said pads; and a plurality of solder bumps formed in contact respectively with said parts of said pads to thereby provide a solder bump grid array; and wherein each of said pads has a ring-shaped groove formed therein.

\* \* \* \* \*